(12) United States Patent
Lee et al.

(10) Patent No.: US 8,576,318 B2
(45) Date of Patent: Nov. 5, 2013

(54) IMAGE SENSORS AND METHODS OF FABRICATING THE SAME

(75) Inventors: Yun-Ki Lee, Seoul (KR); Duck-Hyung Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 403 days.

(21) Appl. No.: 12/899,273

(22) Filed: Oct. 6, 2010

(65) Prior Publication Data

US 2011/0080511 A1   Apr. 7, 2011

(30) Foreign Application Priority Data

Oct. 7, 2009   (KR) .................. 10-2009-0095324

(51) Int. Cl.
| | |
|---|---|
| H04N 5/217 | (2011.01) |
| H04N 3/14 | (2006.01) |
| H04N 5/335 | (2011.01) |
| H01L 27/00 | (2006.01) |
| H01L 31/062 | (2012.01) |
| H01L 31/113 | (2006.01) |

(52) U.S. Cl.
USPC ........ 348/313; 348/241; 348/294; 250/208.1; 257/291

(58) Field of Classification Search
USPC .................. 348/241, 243, 245, 294, 313; 250/208.1; 257/290–294
See application file for complete search history.

(56) References Cited

U.S. PATENT DOCUMENTS

| | | | | |
|---|---|---|---|---|
| 4,385,947 | A * | 5/1983 | Halfacre et al. | 438/217 |
| 6,828,620 | B2 * | 12/2004 | Pass et al. | 257/315 |
| 7,518,172 | B2 * | 4/2009 | Moon et al. | 257/292 |
| 7,592,644 | B2 * | 9/2009 | Suzuki et al. | 257/184 |
| 2009/0206432 | A1 * | 8/2009 | Kim et al. | 257/432 |

FOREIGN PATENT DOCUMENTS

| | | |
|---|---|---|
| JP | 2004-235621 A | 8/2004 |
| JP | 2008-066410 A | 3/2008 |
| JP | 2008-147332 A | 6/2008 |

OTHER PUBLICATIONS

Epitaxy—From Wikipedia, the free encyclopedia. Published Feb. 12, 2009. https://en.wikipedia.org/wiki/Epitaxy Accessed via the Wayback Machine web archive on May 9, 2013. http://web.archive.org/web/20090212190516/http://en.wikipedia.org/wiki/Epitaxy.*

* cited by examiner

*Primary Examiner* — Daniel M Pasiewicz
(74) *Attorney, Agent, or Firm* — Harness, Dickey & Pierce, P.L.C.

(57) ABSTRACT

An image sensor and a method of fabricating the same are provided. The image sensor includes a substrate having a pixel region including a plurality of unit pixels and a non-pixel region, at least one first well in the non-pixel region, an interconnect structure on a first side of the substrate, and a base well in the non-pixel region and between the first well and a second side of the substrate.

19 Claims, 15 Drawing Sheets

IMAGE SENSORS AND METHODS OF FABRICATING THE SAME

CROSS-REFERENCE TO RELATED APPLICATION

This application claims priority under 35 U.S.C. §119 to Korean Patent Application No. 10-2009-0095324 filed on Oct. 7, 2009 in the Korean Intellectual Property Office, the entire contents of which are herein incorporated by reference.

BACKGROUND

1. Field

Example embodiments relate to image sensors and methods of fabricating the same.

2. Description of the Related Art

Image sensors convert optical images into electrical signals. Recent developments in the computer industry and telecommunications industry have led to an increase in demand for high performance image sensors in various applications including digital cameras, camcorders, Personal Communication System (PCS), security cameras, and medical microcameras.

In particular, a MOS image sensor can be readily driven and implemented with various scanning techniques. Further, use of a MOS image sensor will reduce the size of a product since signal processing circuits are integrated into a single chip while lowering the manufacturing cost because a MOS process technology can be compatibly used. With low power consumption, MOS image sensors can be easily applied to battery-powered products. Thus, due to advances in technology and implementation of high resolution, the use of MOS image sensors has rapidly increased.

A MOS image sensor includes a photoelectric transformation unit that senses the magnitude of incident light and a plurality of metal interconnect layers that output optical signals stored in the photoelectric transformation unit. Since the incident light is reflected by the metallic wire layers or absorbed by an interlayer dielectric layer, the sensitivity of the MOS image sensor may be degraded. Further, the reflected light may be absorbed into neighboring pixels, thereby causing crosstalk between the pixels.

Therefore, in order to solve the above problems, a back side illuminated (BI) image sensor has been recently proposed in which a back side of a substrate is polished and light is incident from a front side of the substrate. Because the BI image sensor has no metallic wire layer formed on the front side from which light is incident, the incident light cannot be reflected by a metallic wire layer nor absorbed by an interlayer dielectric layer.

SUMMARY

Example embodiments provide an image sensor designed to stably maintain an electric potential of a well.

Example embodiments also provide a method of fabricating the image sensor capable of stably maintaining an electric potential of a well.

These and other objects of example embodiments will be described in or be apparent from the following description of example embodiments.

According to an aspect of example embodiments, there is provided an image sensor including a substrate having a pixel region including a plurality of unit pixels and a non-pixel region, at least one first well in the non-pixel region, an interconnect structure on a first side of the substrate, and a base well in the non-pixel region and between the at least one first well and a second side of the substrate.

According to another aspect of example embodiments, there is provided an image sensor including a substrate having a pixel region including a plurality of unit pixels and a non-pixel region, a plurality of first wells in the non-pixel region, an interconnect structure on a first side of the substrate, and a base well in the non-pixel region and having a higher doping concentration than a doping concentration of the plurality of first wells. The plurality of first wells contact the base well, and the image sensor is configured to share a first well-bias among the plurality of first wells through the base well if at least one of the plurality of first wells receives the first well-bias.

According to still another aspect of example embodiments, there is provided a method of fabricating an image sensor, the method including forming a first well in a non-pixel region of a substrate, forming an interconnect structure on a first side of the substrate, and forming a base well in the non-pixel region and between the first well and a second side of the substrate.

BRIEF DESCRIPTION OF THE DRAWINGS

The above and other features and advantages of example embodiments will become more apparent by describing in detail example embodiments thereof with reference to the attached drawings in which.

DETAILED DESCRIPTION OF EXAMPLE EMBODIMENTS

Figure 1:
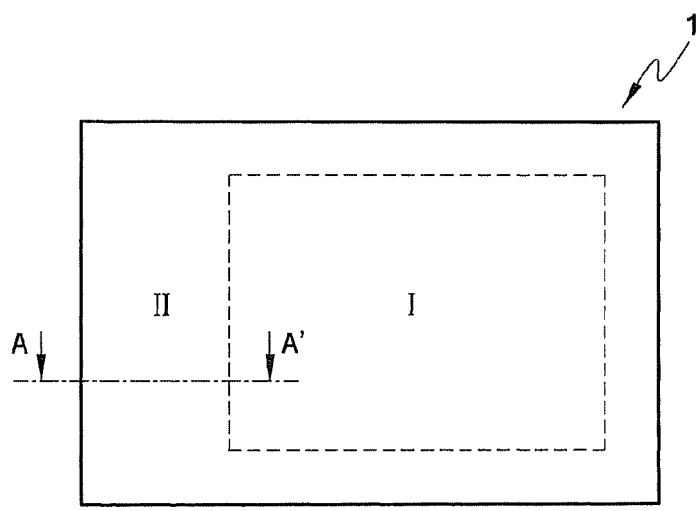
FIG. 1 is a diagram for explaining a pixel region I and a non-pixel region II in an image sensor 1 according to an example embodiment.

Advantages and features of example embodiments and methods of accomplishing the same may be understood more readily by reference to the following detailed description of example embodiments and the accompanying drawings. Example embodiments may, however, be embodied in many different forms and should not be construed as being limited to the embodiments set forth herein. Rather, these embodiments are provided so that this disclosure will be thorough and complete and will fully convey concepts of example embodiments to those skilled in the art, and example embodiments will only be defined by the appended claims. In the drawings, the size and relative sizes of layers and regions may be exaggerated for clarity.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Like numbers refer to like elements throughout.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Example embodiments are described herein with reference to cross section illustrations that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of example embodiments.

Hereinafter, an image sensor 1 according to an example embodiment will now be described with reference to FIG. 1 through FIG. 3C. FIG. 1 is a diagram for explaining a pixel region I and a non-pixel region II in an image sensor 1 according to an example embodiment, FIG. 2 is a cross-sectional view of the image sensor taken along line A-A' of FIG. 1, and FIG. 3A through FIG. 3C are diagrams for explaining a method of maintaining the potential of a well in the image sensor shown in FIG. 1.

Figure 2:
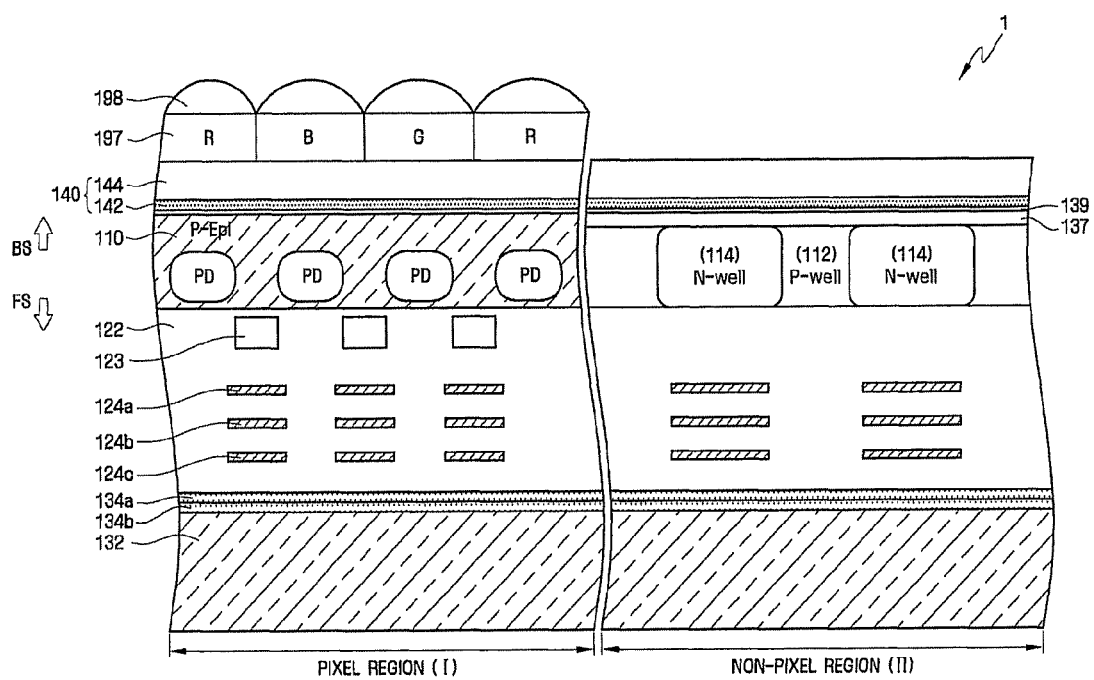
FIG. 2 is a cross-sectional view of the image sensor taken along line A-A' of FIG. 1.

Referring to FIG. 2, the pixel region I includes a charge transport element, a drive element, a reset element, and a selection element. The non-pixel region II includes a resistor, a capacitor, and a complementary metal-oxide-semiconductor (CMOS) element formed simultaneously with readout elements. The elements can be implemented in various configurations that are well known to persons skilled in the art. The elements will not be disclosed nor assigned reference numerals and described in detail in order to avoid ambiguous interpretation.

First, referring to FIGS. 1 and 2, a substrate 110 has defined thereon a pixel region I including a plurality of unit pixels and a non-pixel region II other than the pixel region I. While FIG. 1 shows the pixel region I is surrounded by the non-pixel region II, aspects of example embodiments are not limited thereto. Further, although not shown in FIG. 1, the non-pixel region II may include a peripheral circuit region having circuits for controlling the plurality of unit pixels and a pad region having a plurality of pads.

A plurality of photoelectric transformation elements, e.g., photodiodes (PDs), are formed in the pixel region I of the substrate 110 while a plurality of gates 123 are disposed on the substrate 110. For example, the gates 123 may be gates for the charge transport element, reset element, and drive element. Various types of substrates can be used as the substrate 110. For example, the substrate 110 may be a P- and N-type bulk substrate, P-type bulk substrate on which a P- or N-epi (epitaxy) layer is grown, or N-type bulk substrate in which a P- or N-epi layer is grown. Instead of the semiconductor substrate, an organic plastic substrate may be used as the substrate 110. As shown in FIG. 2, the substrate 110 may include an epi layer that remains after removing a bulk substrate using a polishing process (to be described later with reference to FIG. 12). By removing the bulk substrate using the polishing process, short-wavelength sensitivity of image sensors according to example embodiments can be improved.

The substrate 110 corresponding to the non-pixel region II has formed therein a first well 112 of a first conductivity type (e.g., P-type), a second well 114 of a second conductivity type (e.g., N-type), and a base well 137.

Referring to FIG. 2, a plurality of first wells 112 are formed within the substrate 110 with the second well 114 interposed therebetween. For example, at least one second well 114 may divide the first well 112 into a plurality of regions. Further, the first and second wells 112 and 114 may be in contact with a front side FS of the substrate 110. In this case, the first and second wells 112 and 114 may be formed on the front side FS of the substrate 110 directly or via a contact well (not shown) formed for applying a well-bias to the first and second wells 112 and 114 respectively. The first and second wells 112 and 114 are not limited thereto and may be arranged in various other ways.

The base well 137 is disposed between the first well 112 (and the second well 114) and the back side BS of the substrate 110. For example, if the substrate 110 is divided into two regions along a thickness direction, i.e., a lower region having the front side FS of the substrate 110 and an upper region having the back side BS of the substrate 110, the first and second wells 112 and 114 are formed in the lower region of the substrate 110 while the base well 137 is formed in the upper region of the substrate 110. That is, the base well 137 may be formed as a single layer within the substrate 110.

In this case, the base well 137 is selectively formed on at least a portion of the substrate 110 corresponding to the non-pixel region II. That is, the base well 137 is formed in a portion of or the entire non-pixel region II, not in the pixel region I. By selectively forming the base well 137 only in the non-pixel region II, it is possible to obtain the same effect as when a sub-substrate selectively exists in the non-pixel region II.

The base well 137 may be formed as a single layer within a portion of the substrate 110 corresponding to the non-pixel region II, so that the base well 137 is in contact with at least one of the plurality of first wells 112. Thus, when a first well-bias is applied to one of the plurality of first wells 112, the potential of the plurality of first wells 112 can be maintained at a specific level through the base well 137, which will be described in more detail later with reference to FIGS. 3A through 3C.

The base well 137 may have the same conductivity type as the first well 112. For example, if the first well 112 has a P-type conductivity, the base well 137 may also have a P-type conductivity. For example, impurities of P-type conductivity may include boron (B), boron fluoride ($BF_2$), boron trifluoride ($BF_3$), or phosphorus (P).

Further, the base well 137 has a doping concentration higher than doping concentration of the first well 112, which means the concentration of impurities implanted into the base well 137 is higher than that of impurities implanted into the first well 112.

The first well 112 may have a conductivity type opposite to the conductivity type of the second well 114. For example, if the first well 112 has a P-type conductivity, the second well 114 may have an N-type conductivity. A second well-bias being different from the first well-bias may be applied to the second well 114. Although not described with reference to FIGS. 3A through 3C, the first and second wells 112 and 114 may have various arrangements, shapes, and concentrations.

An interconnect structure 122 and 124a through 124c is disposed on the front side FS of the substrate 110. The interconnect structure 122 and 124a through 124c includes a multi-layered interlayer dielectric layer 122 and a plurality of interconnects 124a through 124c sequentially formed in the pixel region I and the non-pixel region II. The plurality of interconnects 124a through 124c may be made of metal such as aluminum (Al) or copper (Cu). Although not able to be seen in FIG. 2, the interconnect structure may further include sub-pads formed in the pad region of the non-pixel region II.

A support substrate 132 is fixedly attached to the interconnect structure 122 and 124a through 124c in order to provide a sufficient strength for the substrate 110 thinned by polishing. The support substrate 132 may be a semiconductor substrate or a substrate made of any other material that can provide a mechanical strength. For example, the support substrate 132 may be a silicon substrate or glass substrate.

To attach the interconnect structure 122 and 124a through 124c to the support substrate 132, adhesion layers 134a and 134b may be interposed therebetween. For example, if the support substrate 132 is a silicon substrate, the adhesion layers 134a and 134b may be made of silicon oxide.

A pinning layer 139 and a BS insulating layer 140 are formed on the back side BS of the substrate 110.

The pinning layer 139 may be formed on a portion of or the entire back side BS of the substrate 110. For example, if a mask pattern is not used, the pinning layer 139 may be formed in both of the pixel region I and the non-pixel region II. In this case, only the pinning layer 139 is formed on the back side BS of the substrate 110 corresponding to the pixel region I while the base well 137 and the pinning layer 139 are both fowled on the back side BS corresponding to the non-pixel region II. In the non-pixel region II, the pinning layer 139 is formed at a position closer to the back side BS of the substrate 110 than the base well 137. That is, the pinning layer 139 is formed on an upper portion of the substrate 110, compared to the base well 137.

If the photoelectric transformation element formed in the pixel region I is an N-type photodiode (PD), the P+-type pinning layer may be formed so as to reduce dark current by decreasing Electron-Hole Pairs (EHPs) thermally created on the back side BS of the substrate 110. Depending upon the application, the pinning layer 139 may be omitted.

According to an example embodiment, the BS insulating layer 140 includes an anti-reflective layer 142 and a buffer layer 144. The material/thickness of the anti-reflective layer 142 may vary depending on the wavelength of light that will be used during a photo process. For example, the anti-reflective layer 142 may include a stack of silicon oxide layer having a thickness of about 50 to about 200 Å and silicon nitride layer having a thickness of about 300 to about 500 Å. The buffer layer 144 is formed on the anti-reflective layer 142 so as to prevent damage to the substrate 110 during a patterning process for forming pads (not shown) within the non-pixel region II. For example, the buffer layer 144 may be a silicon oxide layer having a thickness of about 3,000 to about 8,000 Å.

Color filters 197 and microlenses 198 are arranged on the back side BS of the substrate 110 corresponding to the pixel region I in which the photodiodes (PDs) have been formed. Although not shown in FIG. 2, a planarization layer may be formed between the color filters 197 and the microlenses 198 or below the color filters 197.

Although not able to be seen in FIG. 2, the pads may be disposed on the back side BS of the substrate 110 corresponding to the non-pixel region II. The sub-pads and the pads are electrically connected to one another via the BS insulating layer 140 and a contact penetrating the substrate 110.

The image sensor 1 according to an example embodiment includes the base well 137 selectively formed in the non-pixel region II of the substrate 110. Thus, a first well-bias applied to one of the plurality of first wells 112 can be shared with another first well 112 through the base well 137. Due to this configuration, the image sensor 1 can stably maintain the potential of the first wells 112. A method of stably maintaining the potential of the first wells 112 will be described in more detail with reference to FIGS. 3A through 3C.

Figure 3A:
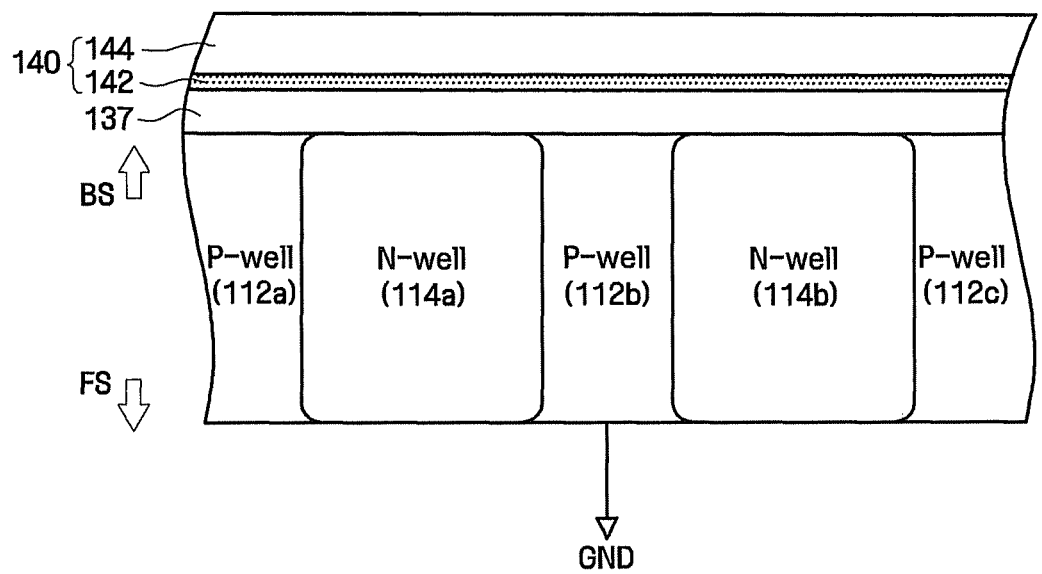
FIG. 3A through FIG. 3C are diagrams for explaining a method of maintaining the potential of a well in the image sensor shown in FIG. 1.
Figure 3B:
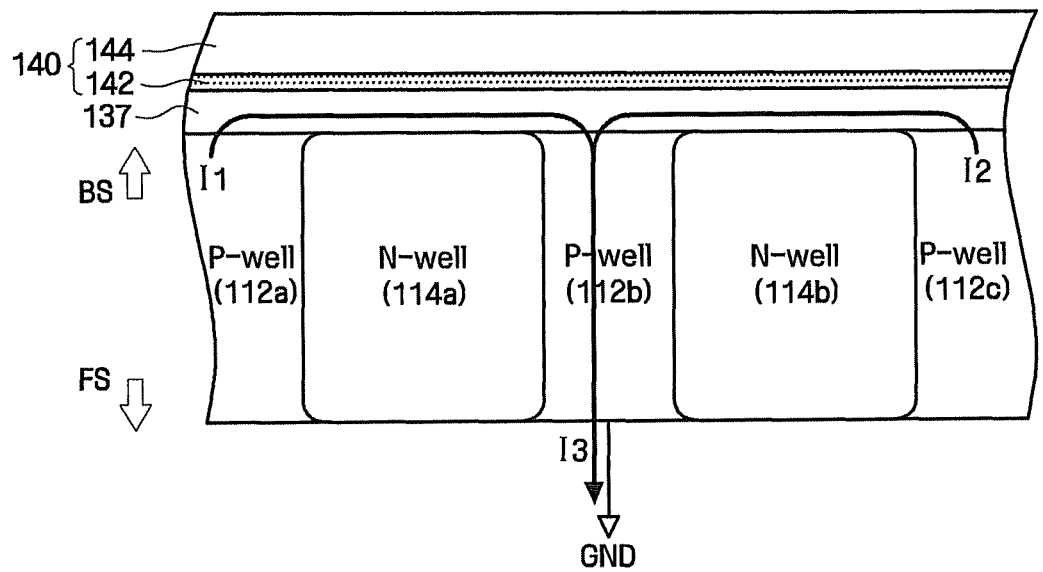
Figure 3C:
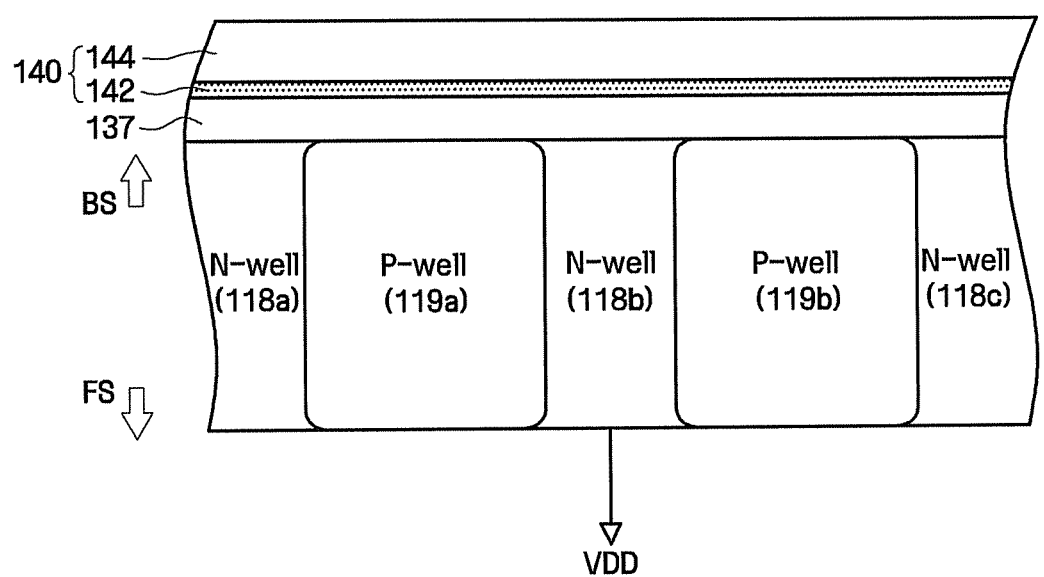

FIGS. 3A and 3B illustrate a structure as shown in FIGS. 1 and 2 in which the base well 137 is formed on the back side BS of the substrate 110 corresponding to the non-pixel region II and a first well-bias is applied to the front side FS of the substrate 110. FIG. 3C illustrates a structure in which first wells 118a through 118c of N-type conductivity are separated from one another by the second wells 119a and 119b of P-type conductivity.

Referring to FIGS. 3A and 3B, the first well-bias may be applied to a first well 112b through the front side FS of the substrate 110. In this case, to reduce the size of a separate additional space for applying a well-bias to the front side FS of the substrate 110, the first well-bias may not be applied separately to each of a plurality of first wells 112a, 112b, and 112c. As described above, since the base well 137 contacts the plurality of first wells 112a, 112b, and 112c, current I1 may flow from the first well 112a to the base well 137 while current I2 may flow from the first well 112c to the base well 137. The currents I1 and I2 combine in the base well 137, which allows current I3 to flow into the first well 112b to which a ground voltage GND is applied. Thus, even through the first wells 112a, 112b, and 112c are separated from one another by the second wells 114a and 114b, they can maintain a stable potential.

Referring to FIG. 3C, when first wells 118a, 118b, and 118c have an N-type conductivity, the first well-bias may be a supply voltage VDD. The first wells 118a, 118b, and 118c are isolated from one another by second wells 119a and 119b.

The supply voltage VDD can be applied to the first wells 118a and 118c via the base well 137.

Figure 4:
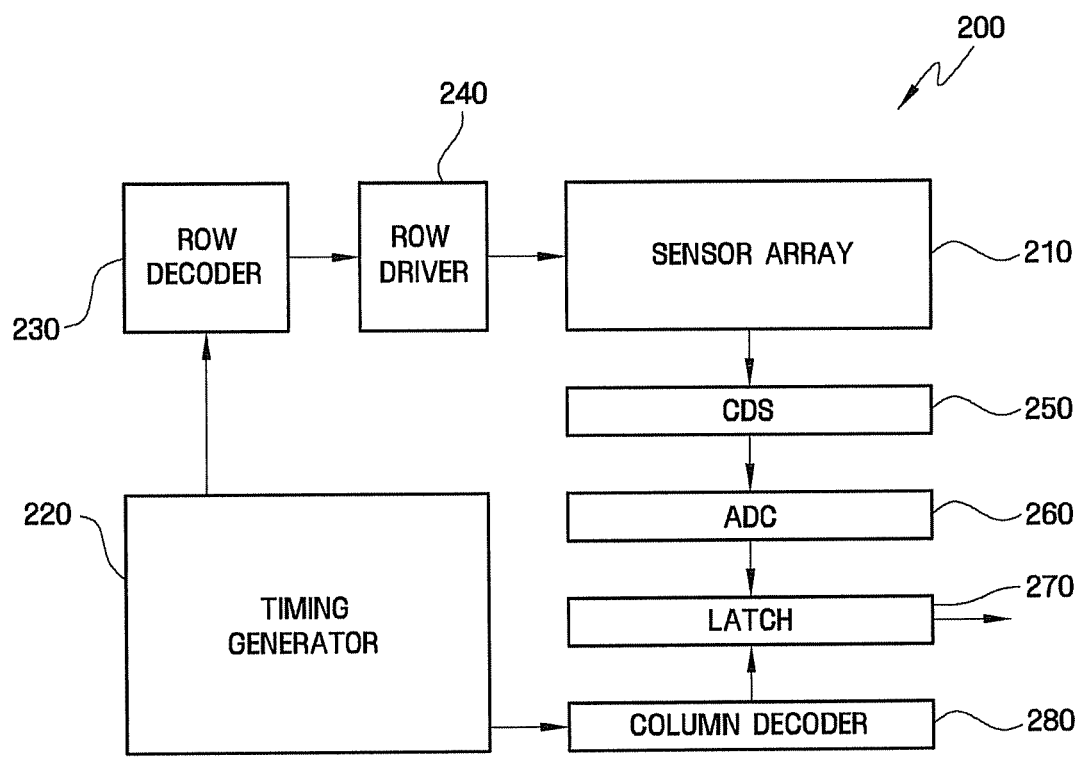
FIG. 4 is a block diagram for explaining a chip on which an image sensor according to an example embodiment.
Figure 5:
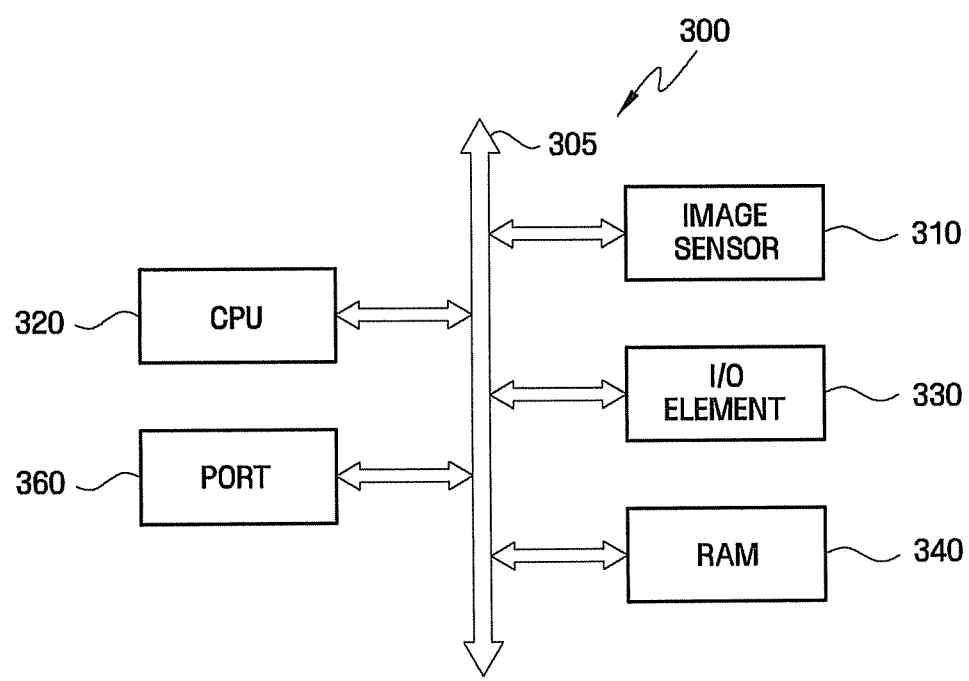
FIGS. 5 through 7 are diagrams for explaining processor-based systems including image sensors according to example embodiments.
Figure 6A:
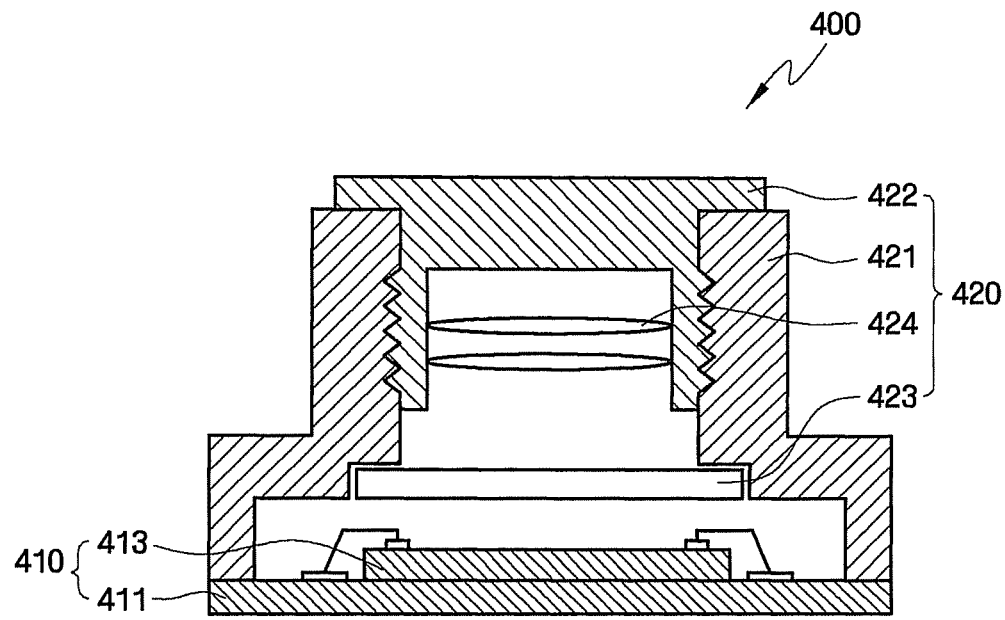
Figure 6B:
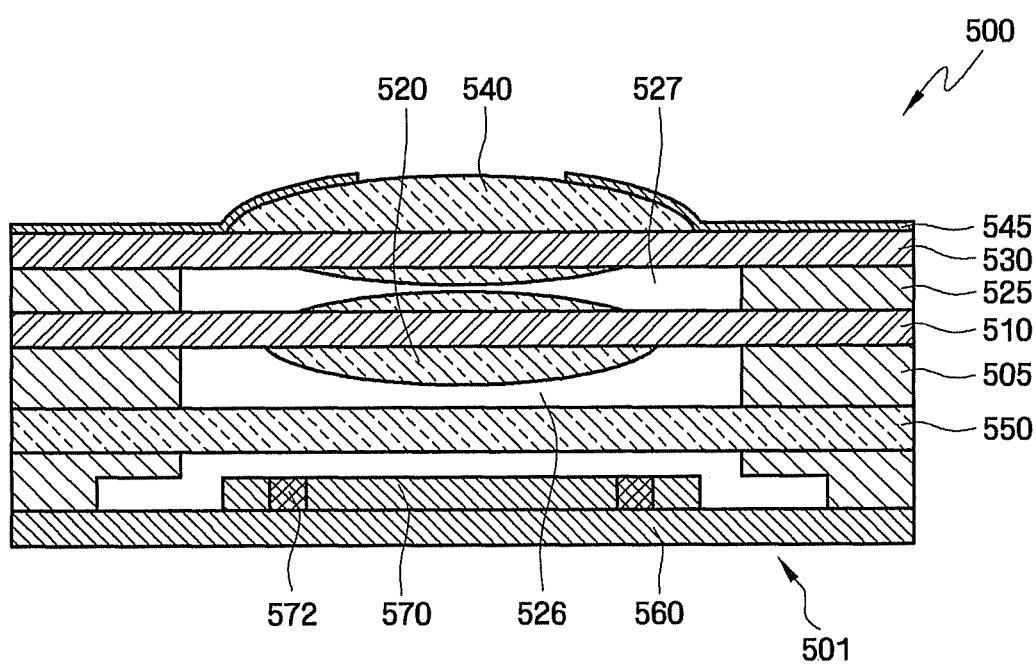
Figure 7:
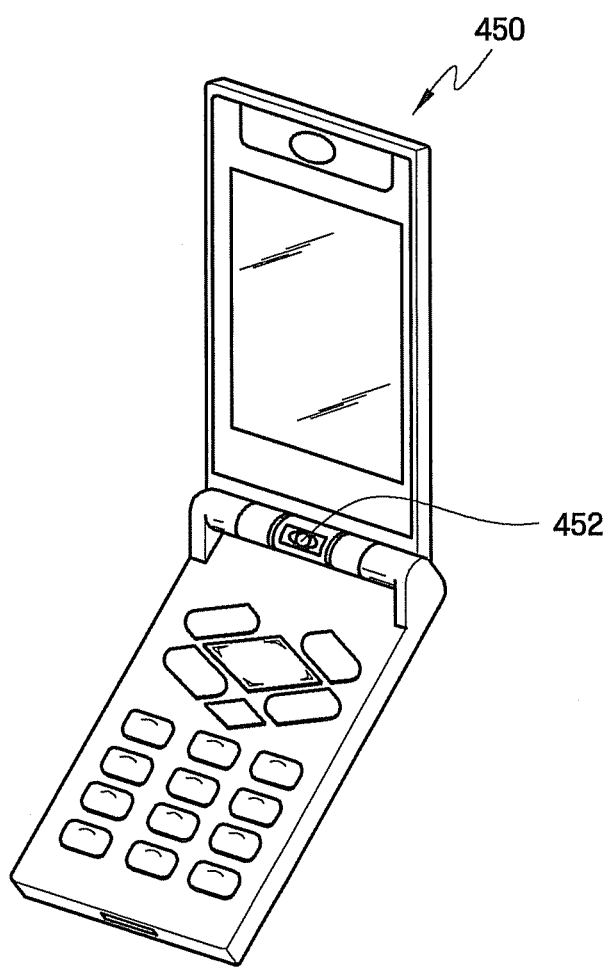

Systems using image sensors according to example embodiments will now be described with reference to FIGS. 4 through 7. FIG. 4 is a block diagram for explaining a chip 200 on which an image sensor according to an example embodiment is implemented. FIGS. 5 through 7 are diagrams for explaining processor-based systems including image sensors according to example embodiments. FIGS. 5, 6A and 6B, and 7 illustrate a computer system 300, camera systems 400 and 500, and a mobile phone system 450, respectively.

It will be apparent to those skilled in the art that image sensors according to example embodiments can be used in other systems such as scanner, mechanized clock system, navigation system, video phone, surveillance system, automatic focus system, tracking device, motion monitoring system, and image stabilization system.

Referring to FIG. 4, the chip 200 includes a sensor array 210 including a two dimensional array of pixels, each containing a light sensing element, a timing generator 220, a row decoder 230, a row driver 240, a correlated double sampler (CDS) 250, an analog-to-digital converter (ADC) 260, a latch 270, and a column decoder 280.

The sensor array 210 includes a plurality of unit pixels arranged in two dimensions. The plurality of unit pixels convert an optical image into an electrical signal. The sensor array 210 operates in response to driving signals received from the row driver 240 including a row selection signal, a reset signal, and a charge transmission signal. The sensor array 210 also provides the electrical signal to the CDS 250 via a vertical signal line.

The timing generator 220 supplies a timing signal and a control signal to the row decoder 230 and the column decider 280. The row driver 240 provides the driving signals to the sensor array 210 to drive the unit pixels according to the decoding result from the row decoder 230. When the unit pixels are arranged in a matrix form, a driving signal is generally provided for each row of unit pixels.

The CDS 250 receives the electrical signal from the sensor array 210 via the vertical signal line and performs holding and sampling operations on the received electrical signal. That is, the CDS 250 double-samples a noise level and a signal level of the electrical signal and outputs a differential level corresponding to the difference between the noise level and the signal level.

The ADC 260 converts an analog signal corresponding to the difference level into a digital signal and outputs the digital signal. The latch 270 latches the digital signal. The latched signal is sequentially output to an image signal processor (not shown) according to the decoding result from the column decoder 280.

All function blocks shown in FIG. 4 can be implemented into a single chip or with several chips. For example, while the timing generator 220 is constructed with one chip, the remaining chips may be integrated into a single chip. For example, the chips can be implemented in a package.

Referring to FIG. 5, the computer system 300 includes a central processing unit (CPU) 320, such as a microprocessor, which can communicate with an input/output (I/O) element 330 through a bus 305. An image sensor 310 can communicate with the computer system 300 via the bus 305 or another communication link. The computer system 300 may further include a random access memory (RAM) 340 and/or a port 360 that are configured to communicate with the CPU 320 via the bus 305. The port 360 may be coupled to a video card, a sound card, a memory card or a universal serial bus (USB) device, or may make communication with another system.

The image sensor 310 can be integrated with a CPU, a digital signal processor, or a microprocessor. Alternatively, the image sensor 310 may be integrated with a memory. When necessary, the image sensor 310 may be integrated on a different chip than the processors.

Referring to FIG. 6A, the camera system 400 includes an image sensor package 410 having an image sensor 413 mounted on a printed circuit board 411 via a bonding wire. A housing 420 is attached to the printed circuit board 411 and protects the printed circuit board 411 and the image sensor 413 from the external environment.

The housing 420 includes a lens barrel unit 421 through which an image to be photographed passes, a protective cover 422 disposed on outer ends of the lens barrel unit 421, and an anti-reflection/infrared ray shielding filter 423 disposed on inner ends of the lens barrel unit 421. A lens 424 is installed in the lens barrel unit 421 and can move along a thread in the lens barrel unit 421.

Referring to FIG. 6B, the camera system 500 includes an image sensor package 501 using a through via 572. When the through via 572 is used, an image sensor 570 can be electrically coupled with a printed circuit board 560 without using a wire bonding technique. Reference numerals 520, 540, and 527 denote a first lens, a second lens, and a lens component, respectively. Reference numerals 505, 525, 526, 545, 550, 510, and 530 denote a support member, a support member, a lens component, an aperture, glass, a transparent substrate, and glass, respectively.

Referring to FIG. 7, the mobile phone system 450 has an image sensor 452 embedded at a specific position thereof. It will be apparent to those skilled in the art that the image sensor 452 can be attached at a different position than the position illustrated in FIG. 7.

Figure 8:
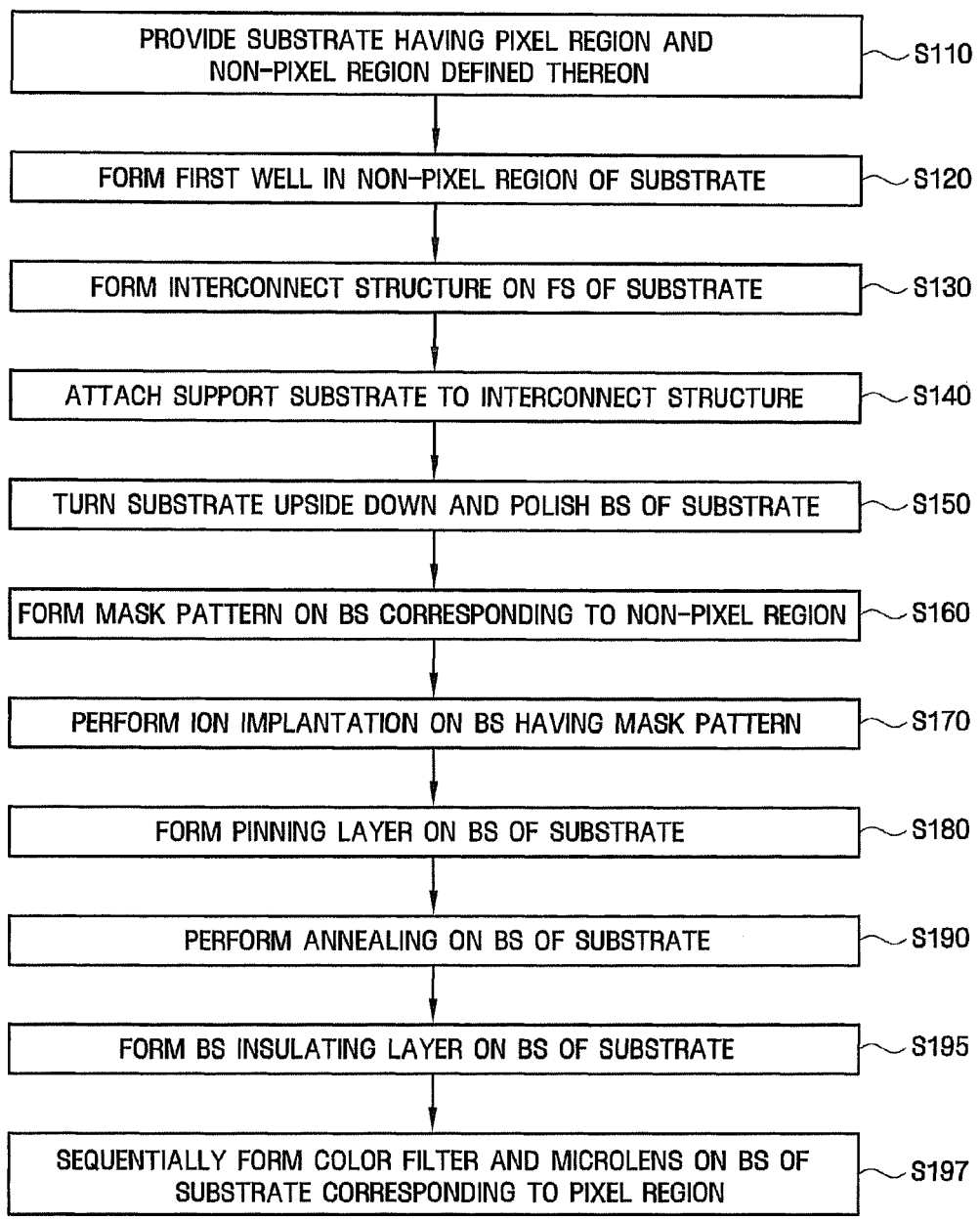
FIG. 8 is a flowchart illustrating a method of fabricating an image sensor according to an example embodiment.

A method of fabricating an image sensor according to an example embodiment will be described with reference to FIGS. 8 through 17. FIG. 8 is a flowchart illustrating a method of fabricating an image sensor according to an example embodiment. FIGS. 9 through 17 illustrate intermediate process steps in the method of fabricating the image sensor shown in FIG. 8.

Figure 9:
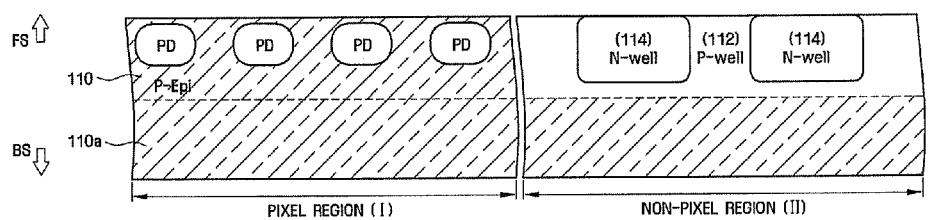
FIGS. 9 through 17 illustrate intermediate process steps in the method of fabricating the image sensor shown in FIG. 8.

Referring to FIGS. 8 and 9, a substrate 110 having a pixel region I and a non-pixel region II defined thereon is provided (S110). A first well 112 is then formed within the substrate 110 corresponding to the non-pixel region II (S120).

More specifically, a device isolation region (not shown) is formed in the substrate 110 and 110a using Shallow Trench Isolation (STI) or Deep Trench Isolation (DTI) to define the pixel region I and the non-pixel region II on the substrate 110. For example, the substrate 110a may be a P- or N-type bulk substrate, or P- or N-epi layer formed on the P- or N-type bulk substrate.

Subsequently, a plurality of pixels are formed in the pixel region I. More specifically, photoelectric transformation elements, i.e., photodiodes (PDs), are provided in the pixel region I while a plurality of gates 123 are provided on the pixel region I. The gates 123 may be gates for the charge transport element, reset element, and drive element.

A first well 112 of a first conductivity type (e.g., P-type), a second well 114 of a second conductivity type (e.g., N-type) are thereafter formed in the non-pixel region II. The first and second wells 112 and 114 may have various arrangements, shapes, and concentrations.

Figure 10:
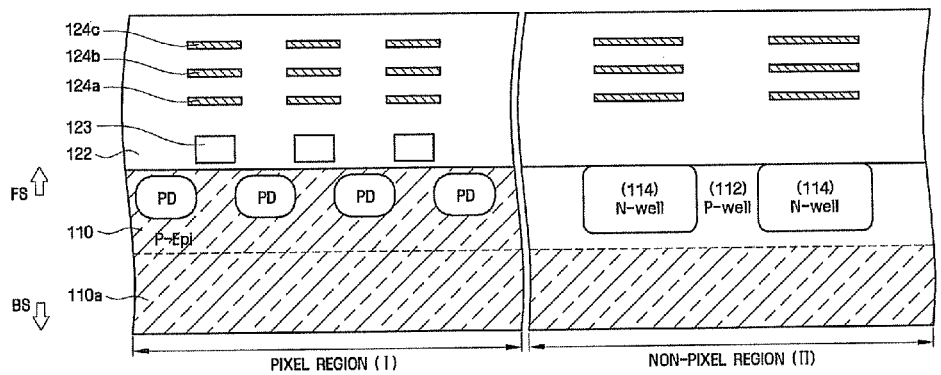

Referring to FIGS. 8 and 10, an interconnect structure 122 and 124a through 124c is formed on the front side FS of the substrate 110 (S130). The interconnect structure 122 and 124a through 124c includes an interlayer dielectric layer 122 and a plurality of interconnects 124a through 124c sequentially formed in the pixel region I and the non-pixel region II.

Figure 11:
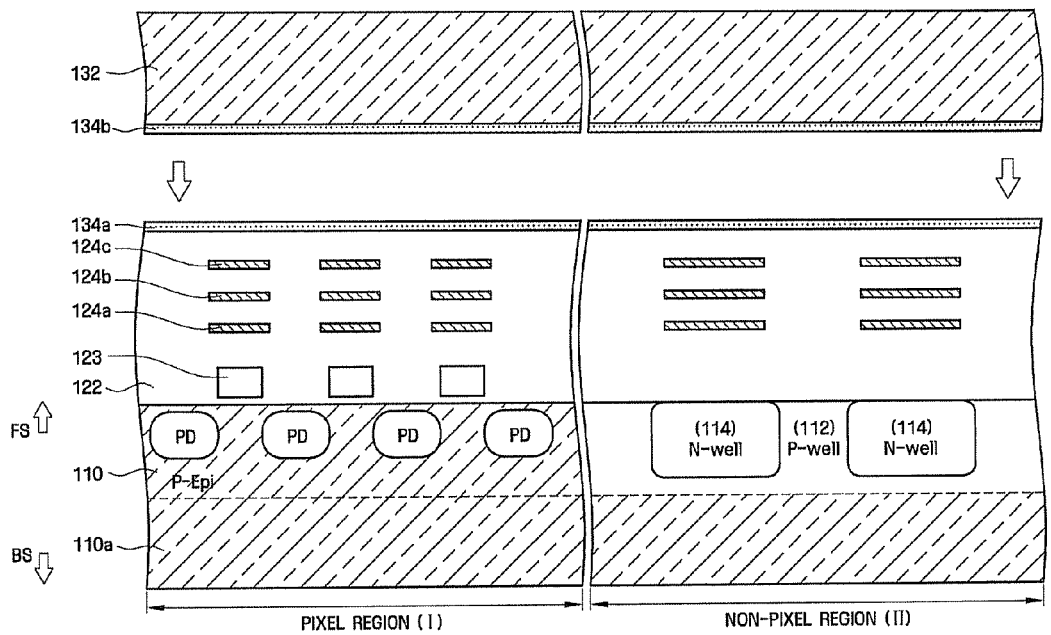

Referring to FIGS. 8 and 11, a support substrate 132 is attached onto the interconnect structure 122 and 124a through 124c (S140). More specifically, while an adhesion layer 134a is applied on the interconnect structure 122 and 124a through 124c to planarize the surface thereof, an adhesion layer 134b is applied on the support substrate 132. With the adhesion layers 134a and 134b facing each other, the substrate 110 is attached onto the support substrate 132.

Figure 12:
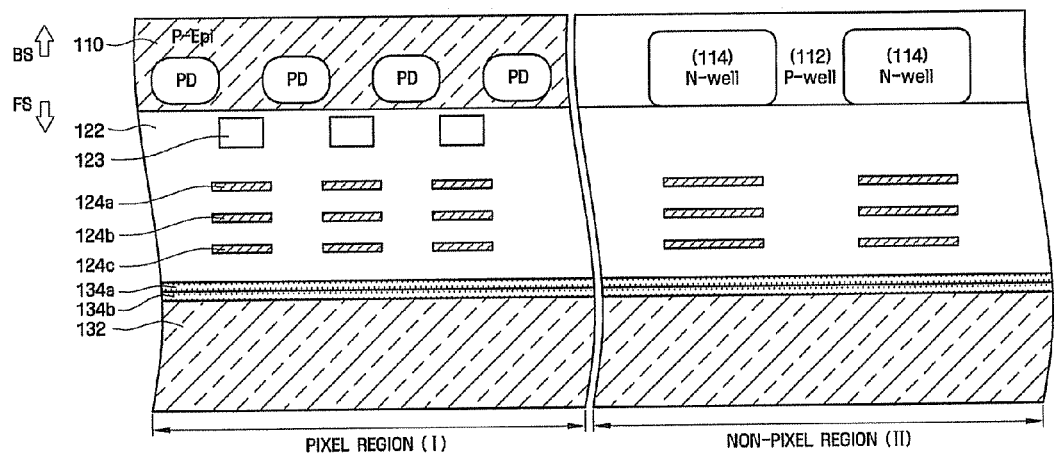

Referring to FIGS. 8 and 12, the substrate 110 and 110a to which the support substrate 132 adheres is flipped upside down, and the back side BS of the substrate 110 and 110a is polished (S150). More specifically, the back side BS of the substrate 110 is polished using Chemical Mechanical Polishing (CMP), BGR Back Grinding (BGR), reactive ion etching (RIE), or any combination thereof. The bulk substrate 110a may be completely removed by the polishing process, but aspects of example embodiments are not limited thereto. For example, a portion of the bulk substrate 110a may remain. By removing the bulk substrate 110a using the polishing process, it is possible to fabricate an image sensor with improved short-wavelength sensitivity.

Figure 13A:
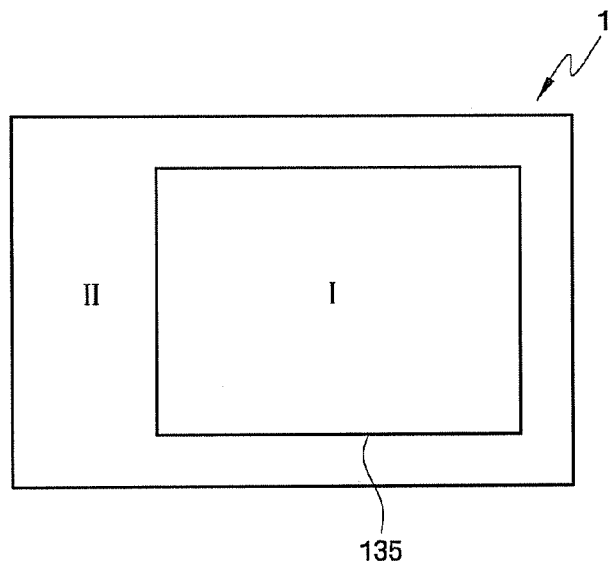
Figure 13B:
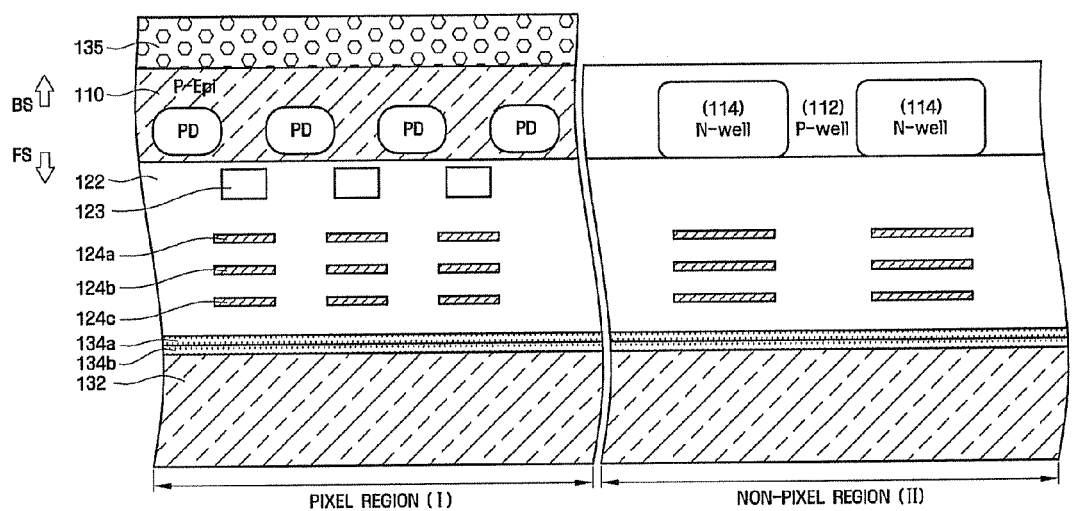

Referring to FIGS. 8, 13A, and 13B, a mask pattern 135 is formed on the back side BS of the substrate 110 corresponding to the non-pixel region II (S160). As shown in FIGS. 13A and 13B, the mask pattern 135 shields the pixel region I. That is, the mask pattern 135 may be formed so as not to implant impurities into the pixel region I during subsequent ion implantation for forming a base well (137 in FIG. 2). For example, the mask pattern 135 may be formed by a photolithography process using photoresist, but is not limited thereto.

Figure 14:
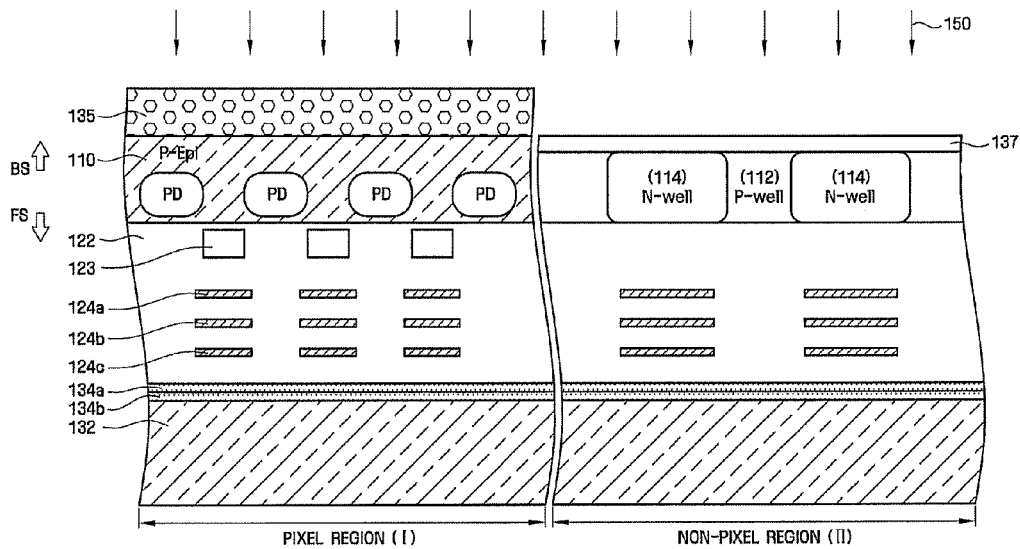

Referring to FIGS. 8 and 14, ion implantation 150 is performed on the back side BS of the substrate 110 having the mask pattern 135 (S170) to selectively form a base well 137 within the substrate 110 corresponding to the non-pixel region II. For example, in order to form the P-type base well 137, the ion implantation 150 may be performed using P-type impurities such as B, $BF_2$, $BF_3$, P, or a combination thereof.

Since the mask pattern 135 includes a shielding region corresponding to the pixel region I, impurities can be selectively implanted into the substrate 110 corresponding to the non-pixel region II to form the base well 137 in the non-pixel region II.

By adjusting process conditions for the ion implantation 150, the depth of the base well 137 formed by implanting the impurities can be determined. For example, in the manufacturing of an image sensor according to an example embodiment, the process conditions such as temperature or pressure may be adjusted to form the base well 137 with a depth corresponding to the space between the second well 114 and the back side BS of the substrate 110 as shown in FIG. 14.

Further, since the base well 137 is formed to contact the plurality of first wells 112, a first well-bias applied to one of the plurality of first wells 112 can be shared among the plurality of first wells 112 through the base well 137. For example, if a ground voltage GND is applied to one of the plurality of first wells 112, the potential of the first wells 112 can be stably maintained by the base well 137 even though the plurality of first wells 112 are separated from one another by the second well 114.

Figure 15:
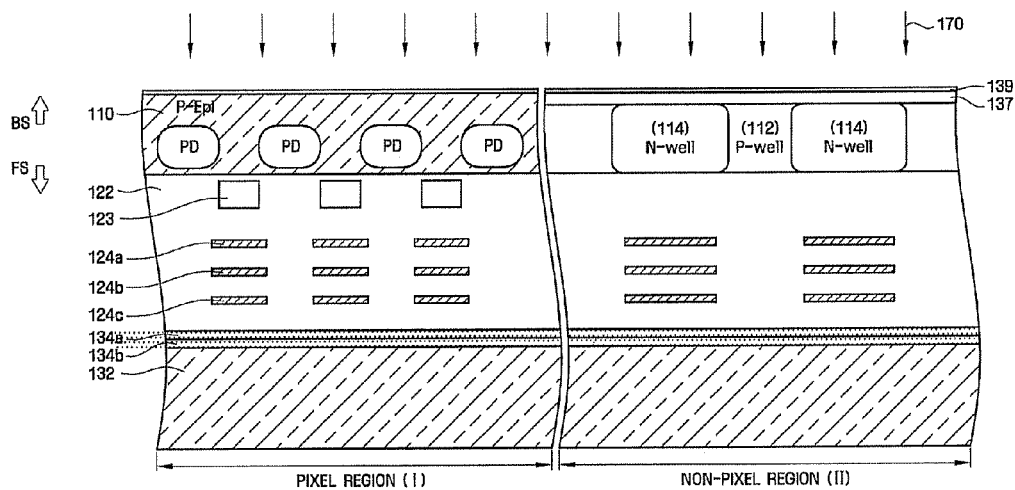

Referring to FIGS. 8 and 15, a pinning layer 139 is formed on the back side BS of the substrate 110 (S180). Ion implantation 170 is performed on the back side BS of the substrate 110 to form the pinning layer 139 thereon. The pinning layer 139 may be formed over the entire back side BS of the substrate 110 or be selective formed on a portion of the substrate 110. For example, if the ion implantation 170 is performed without using a mask pattern, the pinning layer 139 may be formed over the entire back side BS of the substrate 110.

For example, if the photoelectric transformation element, i.e., the photodiode (PD) has an N-type conductivity, P-type impurities may be used during the ion implantation 170. Further, the concentration of the impurities can be adjusted such that the pinning layer 139 has a P+-type conductivity. When necessary, the step of forming the pinning layer 139 may be omitted.

Figure 16:
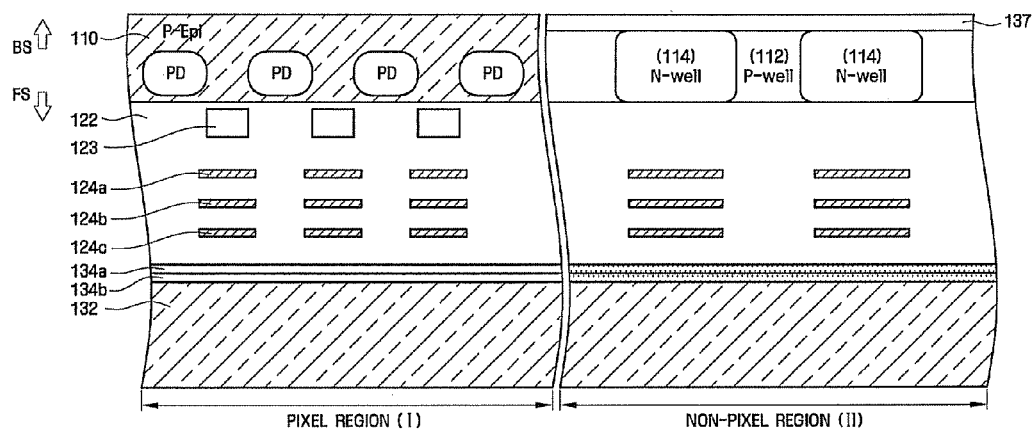

Referring to FIGS. 8 and 16, annealing 160 is performed on the back side BS of the substrate 110 (S190). The back side BS of the substrate 110 is annealed considering the plurality of interconnects 124a through 124c contained in the interconnect structure 122 and 124a through 124c. For example, laser annealing, flash lamp annealing, or UV annealing may be used. If the step of forming the pinning layer 139 is omitted, formation of the base well 137 and the annealing 160 may be consecutively performed.

Figure 17:
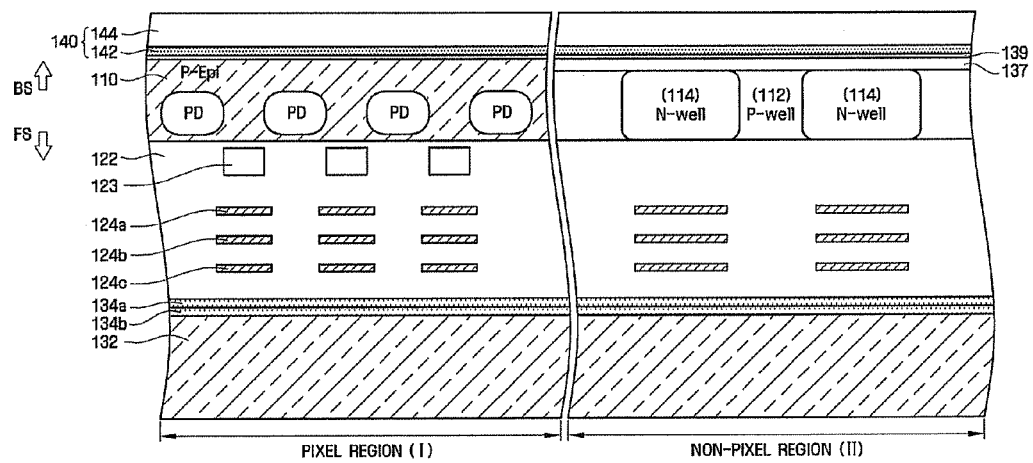

Referring to FIGS. 8 and 17, a BS insulating layer 140 is formed on the back side BS of the substrate 110 (S195). The BS insulating layer 140 is formed by sequentially forming an anti-reflective layer 142 and a buffer layer 144. The material/thickness of the anti-reflective layer 142 may be determined depending on the wavelength of light that will be used during a photo process. The buffer layer 144 is formed on the anti-reflective layer 142 so as to prevent damage to the substrate 110 during a patterning process for forming pads (not shown) within the non-pixel region II.

Turning to FIGS. 2 and 8, color filters 197 and microlenses 198 are sequentially formed at positions corresponding to the pixel region I in which the photodiodes (PDs) have been formed (S197). Although not shown in FIG. 2, a planarization layer may be formed between the color filters 197 and the microlenses 198 or below the color filters 197.

Figure 18:
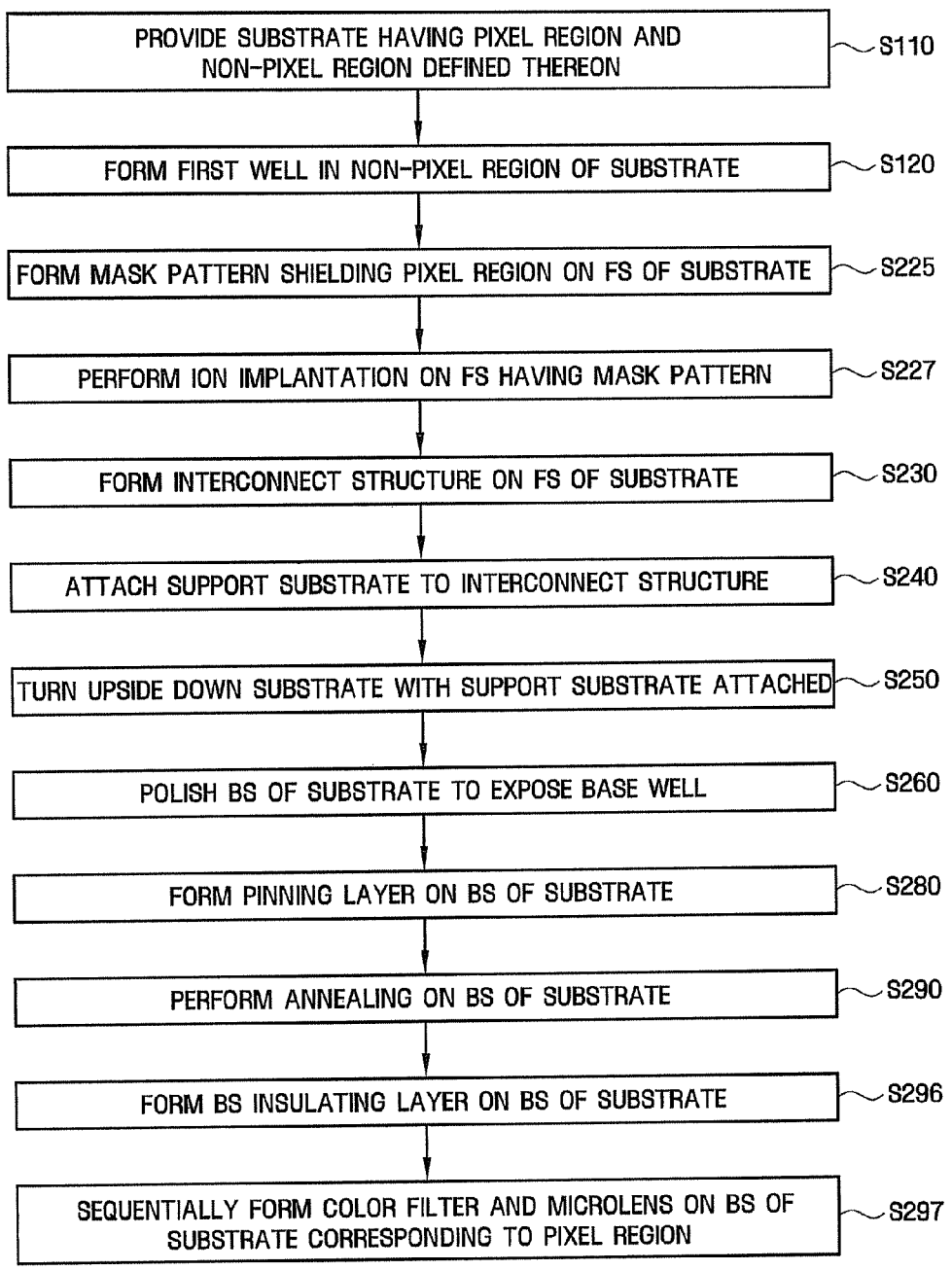
FIG. 18 is a flowchart illustrating a method of fabricating an image sensor according to another example embodiment.
Figure 19:
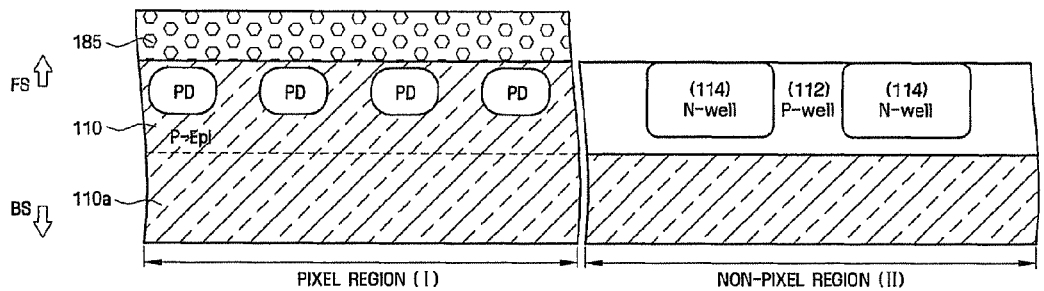
FIGS. 19 through 21 illustrate intermediate process steps in the method of fabricating the image sensor shown in FIG. 18.
Figure 20:
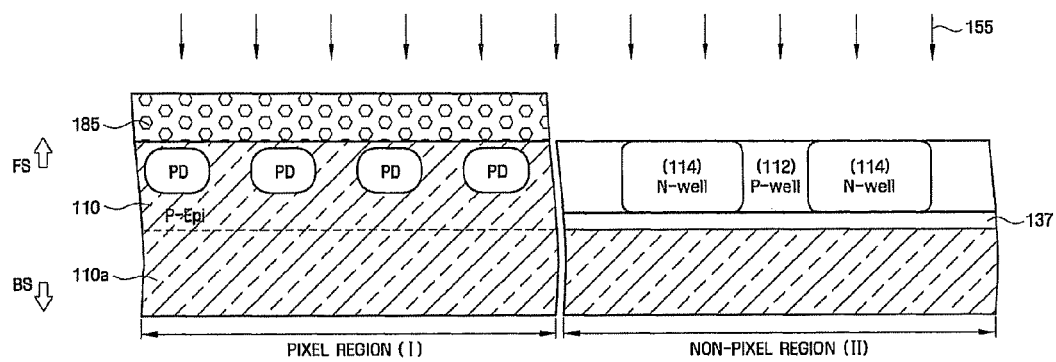
Figure 21:
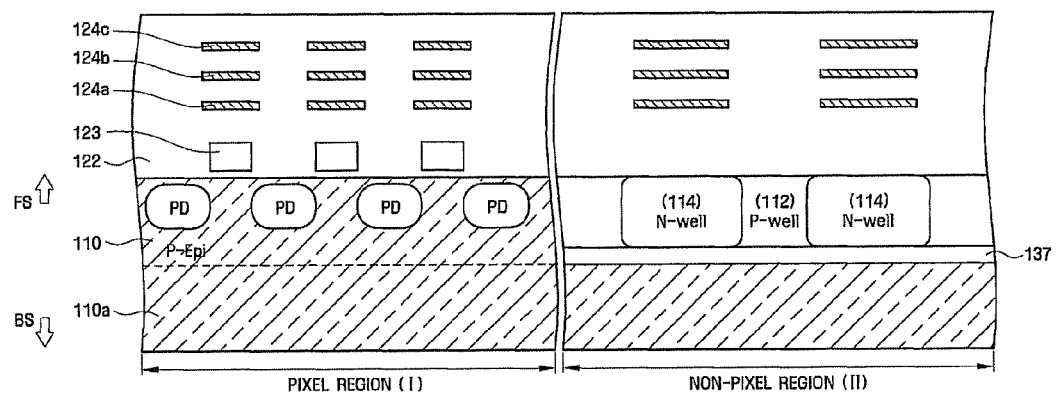

A method of fabricating an image sensor according to another example embodiment will be described with reference to FIGS. 18 through 21. FIG. 18 is a flowchart illustrating a method of fabricating an image sensor according to another embodiment of example embodiments. FIGS. 19 through 21 illustrate intermediate process steps in the method of fabricating the image sensor shown in FIG. 18.

The method of fabricating an image sensor according to the current embodiment is different from the fabrication method according to the previous embodiment in that ion implantation is performed on a front side FS of a substrate to for in a base well prior to forming an interconnect structure. For convenience of explanation, the description will be focused on the difference. Like in the previous embodiment, a substrate 110 having a pixel region I and a non-pixel region II defined thereon is provided (S110) and a plurality of first wells 112 are formed within the substrate 110 corresponding to the non-pixel region II (s120). Thus, the subsequent steps will now be described with reference to FIGS. 18 through 21.

Referring to FIGS. 18 and 19, a mask pattern 185 is formed on the front side FS of the substrate 110 so as to shield the pixel region I (S225). The mask pattern 185 may be formed so as not to implant impurities into the pixel region I during subsequent ion implantation. The mask pattern 185 may be formed using photoresist, but is not limited thereto.

Referring to FIGS. 18 and 20, ion implantation 155 is performed on the front side FS of the substrate 110 including the mask pattern 185 (S227) to selectively form a base well 137 within the substrate 110 corresponding to the non-pixel region II. For example, during the ion implantation 155, P-type impurities may be used to form a P-type base well 137. In this case, by adjusting process conditions for the ion implantation 155 such as temperature or pressure, the base well 137 may be formed between the bulk substrate 110a and the second well 114.

Referring to FIGS. 18 and 21, an interconnect structure 122 and 124a through 124c is formed on the front side FS of the substrate 110 (S230).

More specifically, the interconnect structure 122 and 124a through 124c includes an interlayer dielectric layer 122 and a plurality of interconnects 124a through 124c sequentially formed in the pixel region I and the non-pixel region II.

Those skilled in the art are able to infer the subsequent steps from the method of fabricating an image sensor according to the previous embodiment. The subsequent steps may include attaching a support substrate onto the interconnect structure 122 and 124a through 124c (S240), turning the substrate 110 having the support substrate attached thereon upside down (S250), polishing the back side BS of the substrate 110 to expose the base well 137 (S260), forming a pinning layer on the back side BS of the substrate 110 (S280), performing annealing on the back side BS of the substrate 110 (S290), forming a BS insulating layer on the back side BS of the substrate 110 (S295), and sequentially forming color filters and microlenses on the back side BS of the substrate 110 corresponding to the pixel region I (S297). That is, except for the formation of the base well 137 contacting the plurality of first wells 112 in the substrate 110, the above subsequent steps can readily be inferred by a person having ordinary skill in the art to which example embodiments pertain.

While example embodiments have been particularly shown and described with reference to example embodiments thereof, it will be understood by those of ordinary skill in the art that various changes in form and details may be made therein without departing from the spirit and scope as defined by the following claims. It is therefore desired that example embodiments be considered in all respects as illustrative and not restrictive, reference being made to the appended claims rather than the foregoing description to indicate the scope of example embodiments.

What is claimed is:

1. An image sensor comprising:
a substrate having a pixel region including a plurality of unit pixels and a non-pixel region;
at least one first well in the non-pixel region;
an interconnect structure including an interlayer dielectric layer on a first side of the substrate; and
a base well in the non-pixel region and between the at least one first well and a second side of the substrate, wherein the base well does not overlap the unit pixels in the pixel region, and wherein the base well does not contact the interlayer dielectric layer.

2. The image sensor of claim 1, wherein the at least one first well has a same conductivity type as the base well.

3. The image sensor of claim 2, wherein the base well has a doping concentration higher than a doping concentration of the at least one first well.

4. The image sensor of claim 1, further comprising a number of additional first wells coupled to the base well, wherein the number of additional first wells are coupled to a first well-bias through the at least one first base well.

5. The image sensor of claim 1, further comprising:
at least one second well between two of the first wells and having a different conductivity type than the at least one first well.

6. The image sensor of claim 1, wherein the base well is a single layer in the non-pixel region.

7. The image sensor of claim 1, further comprising:
a pinning layer on the second side of the substrate.

8. The image sensor of claim 1, further comprising:
a support substrate on the interconnect structure.

9. The image sensor of claim 1, wherein the substrate is an epitaxy (epi) layer.

10. An image sensor comprising:
a substrate having a pixel region including a plurality of unit pixels and a non-pixel region;
a plurality of first wells in the non-pixel region;
an interconnect structure including interlayer dielectric layer on a first side of the substrate; and
a base well in the non-pixel region, the base well having a higher doping concentration than a doping concentration of the plurality of first wells, wherein the base well does not overlap the plurality of unit pixels in the pixel region, and wherein
the base well does not contact the interlayer dielectric layer,
the plurality of first wells are coupled to the base well, and
at least one of the first wells is coupled to a first well-bias through another one of the first wells.

11. The image sensor of claim 10, wherein each of the plurality of first wells and the base well have a same conductivity type.

12. The image sensor of claim 10, further comprising:
at least one second well between two adjacent first wells among the plurality of first wells and having a different conductivity type than the two adjacent first wells.

13. The image sensor of claim 10, wherein the base well is a single layer between each of the plurality of first wells and a second side of the substrate.

14. A mobile device comprising the image sensor of claim 1.

15. A camera comprising the image sensor of claim 1.

16. A computer system comprising the image sensor of claim 1.

17. A mobile device comprising the image sensor of claim 10.

18. A camera comprising the image sensor of claim 10.

19. A computer system comprising the image sensor of claim 10.

* * * * *